(12) United States Patent
Gil et al.

(10) Patent No.: US 12,075,557 B2
(45) Date of Patent: Aug. 27, 2024

(54) METAL CERAMIC SUBSTRATE AND METHOD FOR MANUFACTURING SUCH METAL CERAMIC SUBSTRATE

(71) Applicant: Rogers Germany GmbH, Eschenbach (DE)

(72) Inventors: Vitalij Gil, Hersbruck (DE); Olivier Mathieu, Eschenbach (DE); Sebastian Polster, Eschenbach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 247 days.

(21) Appl. No.: 17/786,062

(22) PCT Filed: Oct. 19, 2020

(86) PCT No.: PCT/EP2020/079346
§ 371 (c)(1),
(2) Date: Jun. 16, 2022

(87) PCT Pub. No.: WO2021/121728
PCT Pub. Date: Jun. 24, 2021

(65) Prior Publication Data
US 2023/0028429 A1    Jan. 26, 2023

(30) Foreign Application Priority Data
Dec. 19, 2019 (DE) ............... 10 2019 135 146.4

(51) Int. Cl.
| H05K 1/02 | (2006.01) |
| C04B 37/02 | (2006.01) |
| H05K 1/03 | (2006.01) |

(52) U.S. Cl.
CPC ......... H05K 1/0203 (2013.01); C04B 37/021 (2013.01); H05K 1/0306 (2013.01);
(Continued)

(58) Field of Classification Search
CPC .................... H05K 1/0203; H05K 1/0306
See application file for complete search history.

(56) References Cited

U.S. PATENT DOCUMENTS

| 3,744,120 A | 7/1973 | Burgess et al. |
| 2014/0367702 A1 | 12/2014 | Yamamoto et al. |
| 2015/0130042 A1 | 5/2015 | Sato |

FOREIGN PATENT DOCUMENTS

| DE | 2319854 C2 | 12/1983 |
| DE | 19927046 B4 | 1/2007 |
(Continued)

OTHER PUBLICATIONS

International Preliminary Report on Patentability for International Application No. PCT/EP2020/079346, Filing Date: Oct. 19, 2020, Mailing Date: Jun. 23,2022 (6 pages).

*Primary Examiner* — Jeremy C Norris
(74) *Attorney, Agent, or Firm* — CANTOR COLBURN LLP

(57) ABSTRACT

A carrier substrate (1) for electrical components, in particular metal-ceramic substrate (1) for electrical components, comprising
an insulation layer (10), the insulation layer (10) preferably having a material comprising a ceramic or a composite comprising at least one ceramic layer,
a component metallization (20) which is formed on a component side (BS) and has a first primary structuring (21), and
a cooling part metallization (30) which is formed on a cooling side (KS) opposite the component side (BS) and has a second primary structuring (31), wherein the insulation layer (10), the component metallization (20) and the cooling part metallization (30) are arranged one above the other along a stacking direction (S), and
(Continued)

wherein the first primary structuring (21) and the second primary structuring (31), as viewed in the stacking direction (S), run congruently at least in portions.

24 Claims, 11 Drawing Sheets

(52) U.S. Cl.
 CPC .... *C04B 2237/407* (2013.01); *C04B 2237/52* (2013.01); *H05K 2201/066* (2013.01)

(56)  References Cited

FOREIGN PATENT DOCUMENTS

| | | |
|---|---|---|
| DE | 102009033029 A1 | 1/2011 |
| DE | 102012102611 A1 | 8/2013 |
| DE | 102013104739 A1 | 9/2014 |
| DE | 102016125348 A1 | 6/2018 |
| EP | 0560259 A1 | 9/1993 |
| EP | 3392907 A1 | 10/2018 |
| JP | 2003324173 A | 11/2003 |

METAL CERAMIC SUBSTRATE AND METHOD FOR MANUFACTURING SUCH METAL CERAMIC SUBSTRATE

CROSS-REFERENCE TO RELATED APPLICATIONS

This application is a National Stage filing of PCT/EP2020/084469, filed Dec. 3, 2020, which claims priority to DE 10 2019 134 004.7, filed Dec. 11, 2019, both of which are incorporated by reference in their entirety herein.

BACKGROUND

The present invention relates to a metal-ceramic substrate and a method of producing such a metal-ceramic substrate.

Carrier substrates for electrical components, for example in the form of metal-ceramic substrates, are sufficiently known from the prior art, for example as printed circuit boards or circuit boards, for example from DE 10 2013 104 739 A1, DE 19 927 046 B4 and DE 10 2009 033 029 A1. Typically, connection areas for electrical components and conductor tracks are arranged on one component side of the metal-ceramic substrate, wherein the electrical components and the conductor tracks can be interconnected to form electrical circuits. Essential components of the metal-ceramic substrates are an insulation layer, which is preferably made of a ceramic, and a metal layer and/or component metallization bonded to the insulation layer. Due to their comparatively high insulation strengths, insulation layers made of ceramics have proven to be particularly advantageous in power electronics. The metal layer can then be structured to realize conductor tracks and/or connection areas for the electrical components.

For such carrier substrates, in particular for metal-ceramic substrates, there is the problem of different thermal expansion coefficients due to the different material selection for the insulation layer on the one hand and metallization on the other, which induce or cause thermomechanical stresses when heat is generated, for example during operation or production of the carrier substrate, which can lead to bending or even damage to the carrier substrate. Therefore, it has become established in the prior art to provide a backside metallization on a side of the insulation layer opposite to the component metallizations in order to counteract bending with the corresponding symmetry with respect to the thermal expansion coefficients in the stacking direction. However, since the component metallization generally does not become thicker than 0.8 mm, a symmetrical design of the backside metallization would result in a correspondingly formed backside metallization being very thin and not providing the required heat capacity, which is desired in particular to provide a buffer in overload situations. Notwithstanding this, the prior art does not structure the backside metallization because this interferes with or degrades a heat flow path in a direction parallel and perpendicular to the main extension plane due to the reduced copper content, which would then have to be replaced by air or a filler. In addition, electrical problems can occur if an insulation trench on the back side of the carrier substrate is not filled and extends to the insulation layer.

Furthermore, the prior art knows cooling structures, for example fin-like heat sinks, which are typically bonded to the backside metallization to provide for the appropriate heat dissipation in operation or during production.

SUMMARY

Based on the prior art, the present invention makes it its object to provide carrier substrates that are improved over those carrier substrates known from the prior art, in particular with regard to their efficiency in the removal of heat or energy and with regard to their measures to counteract thermomechanically induced deflection.

This object is achieved by a carrier substrate for electrical components as described herein and a method for its production as described herein. Further advantages and properties result from the subclaims as well as the description and the accompanying figures.

According to a first aspect of the present invention, a carrier substrate for electrical components, in particular a metal-ceramic substrate for electrical components, is provided comprising an insulation layer, the insulation layer preferably having a material comprising a ceramic or a composite comprising at least one ceramic layer,
a component metallization which is formed on a component side and has a first primary structuring, and
a cooling part metallization which is formed on a cooling side opposite the component side and has a second primary structuring,
wherein the insulation layer, the component metallization and the cooling part metallization are arranged one above the other along a stacking direction and wherein the first primary structuring and the second primary structuring, as viewed in the stacking direction, run congruently at least in portions.

BRIEF DESCRIPTION OF THE DRAWINGS

Further advantages and features result from the following description of embodiments with reference to the attached figures. Individual features of the individual embodiment can thereby be combined with each other within the scope of the invention, which show, in.

DETAILED DESCRIPTION

Figure 1:
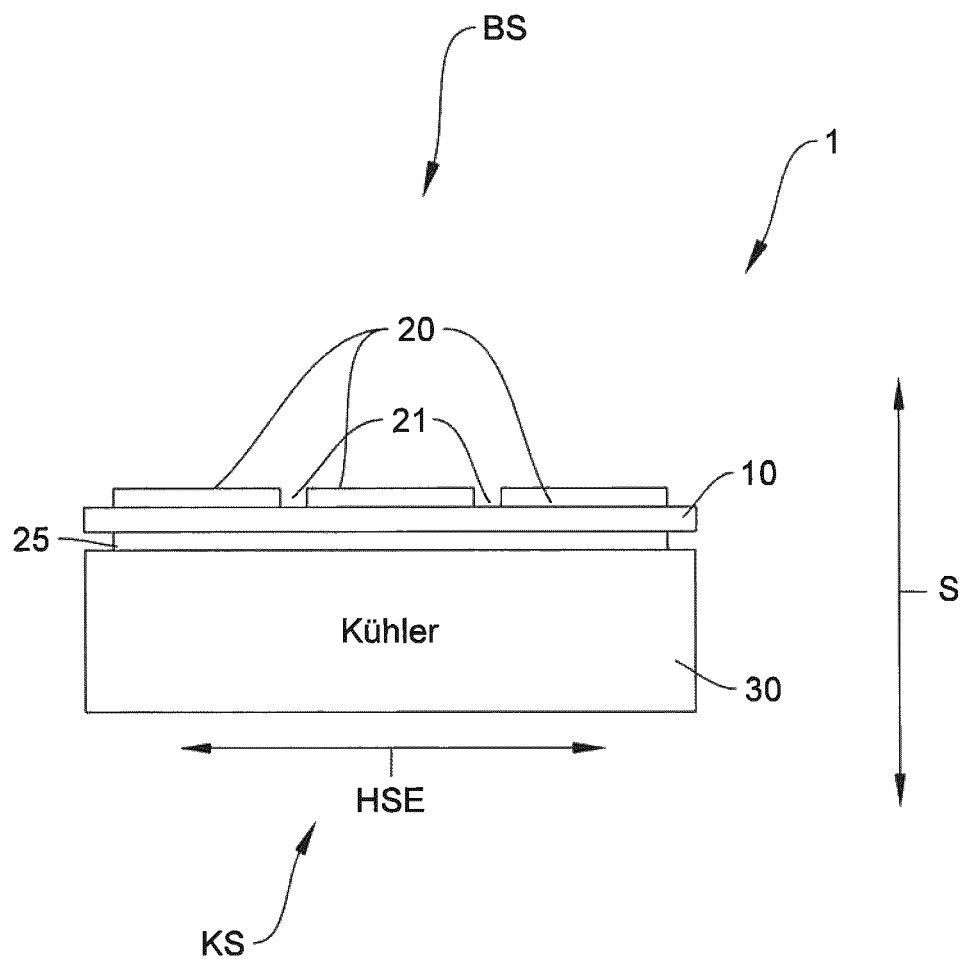
FIG. 1: a carrier substrate according to a prior art embodiment.

Compared with the carrier substrates known from the prior art, the invention provides for the first primary structuring and the second primary structuring to be congruent at least in portions when viewed in the stacking direction. This significantly increases the symmetrical design between the component metallization and the cooling part metallization, which advantageously counteracts deflection of the carrier substrate. In other words, the symmetrical design between component metallization and backside metallization is not exclusively limited to a corresponding design of the respective thicknesses, but is preferably specifically caused or supported by setting a congruent arrangement of the first and second primary structuring. This advantageously increases the symmetry between the component metallization and the cooling part metallization, wherein deflection can be effectively counteracted.

In this context, structuring, in particular the first primary structuring and the second primary structuring, means recesses or indentations which are formed on the outside of the respective metallization, i.e., the cooling side metallization or component metallization. Therein, the corresponding recesses, i.e., the first primary structuring and/or the second primary structuring, preferably extend along an extension direction that is substantially parallel to the main extension plane. Furthermore, it is provided that the insulation layer, the component metallization, and the cooling part metallization each extend along a main extension plane and are arranged one above the other in a stacking direction which is perpendicular to the main extension plane. In particular, the cooling part metallization is bonded directly, for example via a DCB or an AMB process, to the insulation layer, in particular to a cooling side of the insulation layer. The cooling metallization can also be formed subsequently, for example. For example, a backside metallization is produced for this purpose, for example by means of a DCB or AMB process, and then web-like pin elements are bonded to the backside metallization to form a fin structure for forming the cooling part metallization. Insofar as reference is made to a congruent course in portions, in particular an at least partially congruent arrangement along the respective extension directions of the first primary structuring and the second primary structuring is to be understood. For example, the structuring of the first primary structuring, the second primary structuring, the first secondary structuring and/or the second secondary structuring has been produced by etching, milling, stamping, extrusion molding, extrusion, cold extrusion or by a combination of these processes.

By a congruent arrangement of the structurings, i.e., the first and the second primary structurings, it is preferably to be understood that, viewed in the stacking direction, the structurings, i.e., the recesses or indentations in the cooling side metallization and the component metallization, are arranged overlapping at least in portions. In other words: Viewed in the stacking direction, the projections of the first primary structuring and second primary structuring overlap. In this context, it is conceivable that the first primary structuring and the second primary structuring have substantially the same width and that the structurings completely overlap when viewed in the stacking direction, i.e., the boundary of the first primary structuring and the second primary structuring are also arranged to be congruent with one another. The congruent arrangement of the first primary structuring and the second primary structuring is also to be understood as one in which the first and the second primary structuring are arranged only partially overlapping one another in the stacking direction. For example, it is also conceivable that the central points or centers of the first primary structuring and the second primary structuring, as viewed in the stacking direction, are arranged one above the other or are offset with respect to one another. Preferably, a distance by which the centers are offset from each other is less than a width of the narrower of the two structurings (i.e., the first primary structuring or the second primary structuring), preferably less than 50% of the width of the narrower of the two structurings, and more preferably less than 25% of the width of the narrower of the two structurings. The center point is to be understood as the center between the lateral boundaries of the structurings in the cooling side metallization and/or the component metallization.

Furthermore, it is conceivable that the proportion of the overlapping area of the first primary structuring and the second primary structuring as viewed in the stacking direction to a width of the first primary structuring or the second primary structuring, preferably the narrower or the wider of the two structuring (i.e., the first primary structuring and the second primary structuring) is greater than 50%, preferably greater than 75%, and more preferably greater than 90%.

It is further conceivable that several first primary structurings are arranged congruently to a second primary structuring as seen in the stacking direction, or several second primary structurings are arranged congruently to a first primary structuring as seen in the stacking direction.

Furthermore, it is preferably provided that the insulation layer is formed from a ceramic layer, in particular a single ceramic layer. It is also conceivable that the insulation layer is multilayer and has, for example, a primary layer formed from ceramic and a secondary layer, a metallic intermediate layer being arranged between the primary and secondary layers, the metallic intermediate layer being thicker, measured in the stacking direction, than the primary and/or secondary layer and/or being larger than 1 mm. In this case, heat splitting can already be supported in the insulating layer, which promotes the dissipation of heat. Thus, the person skilled in the art also understands an insulation layer within the meaning of this application to be a composite which can itself be formed from several layers. It is also conceivable that the insulation layer is a hybrid ceramic layer in which a first layer of a first ceramic material and a second layer of a second ceramic material are arranged one above the other along the stacking direction to form the insulation layer.

It is further provided that the component metallization and/or the cooling part metallization is bonded directly and immediately to the insulation layer, for example bonded by means of a DCB process, an AMB process or by means of a thin film technique. Furthermore, the metal-ceramic substrate comprises at least one metal layer or metal portion, for example as part of the cooling side metallization or the component metallization, which is bonded to an outer side of a ceramic layer, wherein the metal layer and the ceramic layer extend along a main extension plane and are arranged one above the other along a stacking direction extending perpendicular to the main extension plane. As materials for the metallization or the metal section, copper, aluminum, molybdenum and/or alloys thereof, as well as laminates such as CuW, Cu Mo, CuAl, AlCu and/or CuCu are conceivable, in particular a copper sandwich structure with a first copper layer and a second copper layer, wherein a grain size in the first copper layer differs from a second copper layer. Furthermore, it is preferably provided that the at least one metallization, in particular the component metallization, is surface modified. A conceivable surface modification is, for example, sealing with a noble metal, in particular silver and/or gold, or ENIG ("electroless nickel immersion gold") or edge encapsulation on the first or second metallization layer to suppress crack formation or expansion.

Preferably, the ceramic layer comprises $Al_2O_3$, $Si_3N_4$, AlN, an HPSX ceramic (i.e., a ceramic with an $Al_2O_3$ matrix comprising an x-percent proportion of $ZrO_2$, for example $Al_2O_3$ with 9% $ZrO_2$=HPS9 or $Al_2O_3$ with 25% $ZrO_2$=HPS25), SiC, BeO, MgO, high-density MgO (>90% of the theoretical density), TSZ (tetragonally stabilized zirconium oxide) or ZTA as the material for the ceramic. It is also conceivable that the insulation layer is designed as a composite or hybrid ceramic, in which several ceramic layers, which each differ in terms of their material composition, are arranged on top of one another and joined together to form an insulation layer in order to combine various desired properties. Preferably, a ceramic that is as thermally conductive as possible is used for the lowest possible thermal resistance.

Preferably, the metallization is bonded to the insulating layer by means of an AMB process and/or a DCB process.

The skilled person understands a "DCB process" (direct copper bond technology) or a "DAB process" (direct aluminum bond technology) to be such a process which is used, for example, for bonding metal layers or sheets (e.g., copper sheets or foils or aluminum sheets or foils) to one another and/or to ceramics or ceramic layers, using metal or copper sheets or metal or copper foils which have a layer or coating (fusion layer) on their surface sides. In this process, described for example in U.S. Pat. No. 3,744,120 A or in DE23 19 854 C2, this layer or coating (fusion layer) forms a eutectic with a melting temperature below the melting temperature of the metal (e.g., copper), so that by placing the foil on the ceramic and by heating all the layers, these can be bonded to one another, namely by melting the metal or copper essentially only in the region of the fusion layer or oxide layer.

In particular, the DCB process then has, for example, the following process steps:

Oxidizing a copper foil in such a way that a uniform copper oxide layer is formed;
Placing the copper foil on the ceramic layer;
Heating the composite to a process temperature between about 1025 to 1083° C., e.g., to about 1071° C.;
Cooling to room temperature.

By an active soldering process, e.g. for bonding metal layers or metal foils, in particular also copper layers or copper foils with ceramic material, is meant a process which is specifically also used for the production of metal-ceramic substrates, a bond is produced at a temperature between approx. 600-1000° C. between a metal foil, for example copper foil, and a ceramic substrate, for example aluminum nitride ceramic, using a brazing alloy which, in addition to a main component such as copper, silver and/or gold, also contains an active metal. This active metal, which is for example at least one element of the group Hf, Ti, Zr, Nb, Ce, establishes a connection between the brazing alloy and the ceramic by chemical reaction, while the connection between the brazing alloy and the metal is a metallic brazing connection. Alternatively, a thick film process is also conceivable for bonding.

According to a particularly preferred embodiment, the second primary structuring is part of a cooling structure. This gives the second primary structuring a dual functionality, namely in that on the one hand it increases the symmetry in the carrier substrate and on the other hand it allows a cooling fluid, for example a cooling liquid or a cooling gas, to be guided comparatively close to the insulation layer and also increases a contact area between the cooling fluid and the cooling part metallization. This has a positive effect on the cooling efficiency of the cooling part metallization.

According to a further embodiment of the present invention, it is provided that the cooling part metallization has a second secondary structuring, which in particular is part of the cooling structure, wherein the second primary structuring has a second depth and a second width and the second secondary structuring has a further second depth and a further second width, wherein the second depth is larger or smaller than the further second depth and/or the second width is larger or smaller than the further second width.

In particular, it is provided that the second secondary structuring in the cooling part metallization provides a fin structure which is enclosed by the cooling fluid during operation. It is particularly preferred that the second primary structuring and the second secondary structuring form a common cooling structure to which a cooling fluid is jointly supplied and/or along which the cooling fluid is guided. Alternatively, it is also conceivable that the second primary structuring and the second secondary structuring are each supplied with the cooling fluid in isolation. By forming a second depth which is larger than the further second depth of the second secondary structuring, the second primary structuring projects deeply into the cooling part metallization and thus guides the cooling fluid very close to the insulation layer. Furthermore, it is particularly preferably provided that the second secondary structuring, i.e., in particular the fin structure, which is formed by means of the second secondary structuring, is arranged below a metal section of the component metallization as viewed in the stacking direction, the metal section in the component metallization being fixed and/or delimited by the first primary structuring. Insofar as the respective structuring is modulated and/or varies with respect to depth and/or width, the effective depth or width is preferably assumed to be its mean in the direction of extension or along a direction perpendicular to the direction of extension. Furthermore, it is conceivable that the second depth assumes a value that is smaller than 10 mm, preferably smaller than 8 mm and particularly preferably smaller than 7.5 mm or even a value between 1 and 5 mm. Preferably, it is provided that the second depth assumes a value between 1 and 20 mm, preferably between 1.5 and 15 mm and more preferably between 3.5 and 10 mm.

Furthermore, it is conceivable that the component metallization has, in addition to a first primary structuring, a first secondary structuring, with which, for example, connections and/or conductor tracks are selectively produced on the component side. Accordingly, the ratios with respect to depth and width for the first primary structuring and first secondary structuring apply here as described for the second primary structuring and the second secondary structuring. Accordingly, the first primary structuring and the first secondary structuring serve in particular to separate individual module sections from one another in an electronic module and/or carrier substrate.

Preferably, it is provided that the first primary structuring has a first width and the second width is larger than the first width, in particular a ratio between the first width and the second width assumes a value between 0.6 and 1, preferably between 0.7 and 1 and more preferably between 0.8 and 1. By a corresponding design of the second widths, which is larger than the first width, it is possible to convey the cooling fluid even in sections in the second primary structuring directly under the metal section which is isolated and/or limited by the first primary structuring. This can increase the cooling efficiency. Alternatively, it is conceivable that the second width is smaller than the first width. Preferably, a ratio between the second width and the first width assumes a value between 0.6 and 1, preferably between 0.7 and 1, and more preferably between 0.8 and 1. In particular, for the ratio between 0.8 and 1, it has been found that both an effective heat dissipation and an effective counteraction against deflection can be induced and/or conditioned. Preferably, the first width and/or the second width assumes a value between 1 and 10 mm, preferably between 1 and 8 mm and more preferably between 1 and 2 mm.

For example, the first width and/or second width assumes a value of 1.4 mm. Preferably, a further second width assumes a value greater than 1 mm, preferably greater than 1.2 and more preferably greater than 1.5 mm.

It is particularly preferred that the component metallization has a first thickness dimensioned in the stacking direction, wherein the first thickness is at least 1 mm thick, preferably greater than 1.3 mm, and more preferably between 1.5 mm and 3 mm or even between 2 mm and 4 mm. For example, the first thickness is 2 mm. With a correspondingly comparatively large first thickness, heat spreading can already take place in the component metallization, which has an advantageous effect on the overall cooling efficiency of the carrier substrate. With a correspondingly comparatively thick first thickness of the component metallization, the design of the congruent first and second primary structuring proves to be particularly advantageous, since deviations from the symmetry with the corresponding thickness ratios could comparatively quickly and/or easily lead to deflection of the carrier substrate. Therefore, the combination of the congruent arrangement of first and second primary structuring on the one hand and the comparatively first large thickness on the other hand proves to be particularly advantageous.

Preferably, it is provided that the cooling part metallization has a second thickness, wherein preferably a ratio between the first thickness to the second thickness assumes a value of between 0.2 and 0.9, preferably between 0.5 and 0.8 and more preferably between 0.5 and 0.75 and/or wherein the second primary structuring has a residual metal thickness, wherein a ratio of the residual metal thickness to the second thickness assumes a value of between 0.01 and 0.7, preferably between 0.05 and 0.4 and more preferably between 0.1 and 0.3. It is also conceivable that the ratio of the first thickness to the second thickness assumes a value of at least 1, preferably between 1 and 15, more preferably between 1 and 10, and especially preferably between 1.5 and 7.

Preferably, the residual metal thickness assumes a value between 0.1 and 1.5 mm, preferably between 0.2 and 0.7 and more preferably between 0.3 and 0.5 mm. Therein, the residual metal thickness is preferably exactly as thick or thinner than a difference between the second thickness and the further second depth. Therein, the difference between the second thickness and the further second depth determines a continuously extending section of the cooling structure in the region of the second secondary structuring and is thus determined by the distance between the insulating layer and a termination of the second secondary structuring. Preferably, the difference between the second thickness and the further second depth is greater than 1 mm and/or greater than or less than the first thickness. It is also conceivable that the difference between the second thickness and the second depth is approximately equal to the first thickness. Preferably, the difference between the second thickness and the further second depth assumes a value between 0.2 mm and 5 mm, preferably between 0.5 and 3.5 mm, and more preferably a value between 1.5 and 2.5 mm.

In particular, it is conceivable to increase the corresponding heat capacity on the cooling side by forming a residual metal thickness in the area of the second primary structuring in the cooling part metallization. At the same time, it is avoided that in the area of the congruently arranged first primary structure and second primary structure the separation of the cooling side and the component side takes place exclusively through the insulation layer. This advantageously strengthens the substrate in the area of the congruently arranged primary structures, i.e., the first primary structuring and the second primary structuring.

Furthermore, it is conceivable that the difference between the second depth and the further second depth assumes a value between 0.5 and 1.9 mm, preferably between 1.3 and 1.8 mm and more preferably between 1.5 and 1.7. The difference between the second depth and the further second depth describes the thickness of the solid portion of the cooling structure and/or cooling side metallization, in particular extending continuously between two first secondary structurings.

Preferably, it is provided that a ratio of the first thickness to a sum of the further second depth and the residual thickness assumes a value of at least 0.75, preferably at least 1 and more preferably of at least 2. Furthermore, it is preferably provided that the ratio of the first thickness to a sum of the further second depth and the residual thickness assumes a value between 0.75 and 10, preferably between 1 and 8 and more preferably between 1.5 and 5.

The further second depth assumes, for example, a value between 0.5 mm and 30 mm, preferably between 2 and 15 mm or more preferably between 3 mm and 10 mm or even between 1 and 5 mm. Therein, the further second depth is preferably determined by the length of the fins and/or pins. It is also conceivable that the further second depth is thicker than 10 mm.

Preferably, it is provided that the cooling part metallization is directly bonded to the insulation layer. For example, the direct application of the cooling part metallization is carried out by means of a DCB or AMB process. In a corresponding manner, a backside metallization is dispensed with and the cooling part metallization with its second primary structuring and its second secondary structuring is bonded directly to the insulation layer.

Preferably, it is provided that a ratio of a first proportion of non-congruent portions dimensioned in stacking direction to congruent portions dimensioned in stacking direction between the first primary structuring and the second primary structuring is less than 0.6, preferably less than 0.4 and more preferably less than 0.2. A correspondingly large proportion of congruent portions advantageously supports the symmetrical design over the entire carrier substrate, whereby deflection over a large area of the carrier substrate can be avoided.

Preferably, the second primary structuring has an angular, for example rectangular or triangular, a parabolic, a wave-shaped or round termination at its end facing the insulation layer. In particular, it is conceivable that the corresponding shaping of the termination is carried out specifically depending on the intended use of the carrier substrate. Thus, for example, the shaping of the termination can influence the properties of deflection and/or heat dissipation efficiency.

Preferably, it is provided that the second primary structuring is varied, in particular periodically modulated, at least in portions along its extension in a direction running perpendicular to the main extension plane, i.e., along its extension direction. In this way, further measures can be taken to cause a specific adaptation of the heat capacities and/or the deflection and/or reduction of the deflection, which is preferably carried out depending on the planned use of the carrier substrate.

The second primary structuring and/or the second secondary structuring can preferably be carried out by machining a metallization and/or a metal portion, for example before or after bonding to the insulation layer. It is conceivable that the structures are produced by means of etching, milling, stamping, extrusion, cold extrusion and/or the like.

A further object of the present invention is a method for producing a carrier substrate according to the invention, in particular a metal-ceramic substrate, for electrical components. All features described for the carrier substrate apply analogously to the method and vice versa.

Further advantages and features result from the following description of preferred embodiments of the object according to the invention with reference to the attached figures. Therein, individual features of the individual embodiment can be combined with each other within the scope of the invention.

FIG. 1 shows a carrier substrate 1 according to a prior art embodiment. Essential components of such a carrier substrate 1 for electrical or electronic components are an insulation layer 10, which extends essentially along a main extension plane HSE and to the component side BS of which a component metallization 20 is connected. A corresponding structuring of the component metallization 20, in particular in the form of a first primary structuring 21, ensures that the component metallization 20 has individual metal portions insulated from one another, in particular in the form of metal surfaces and/or conductor tracks. For this purpose, the primary structurings 21 extend as far as the insulation layer 10. In particular, a first primary structuring 21, or the general term structuring, is understood by the skilled person to mean the formation of a recess or groove in the corresponding metallization. In the case of the first primary structuring 21 within the component metallization 20, the first primary structuring 21 is an insulation trench which insulates the individual metal portions, which are separated from one another by the primary structuring 21, from one another. Electrical or electronic components can then be connected to the individual metal portions of the component metallization layer 21.

Due to the different thermal expansion coefficients attributable in particular to the insulation layer 10 and the component metallization 20, distortions can occur in the event of heat development occurring, for example, during a production process and/or during operation of the carrier substrate 1, which can lead to deflection of the carrier substrate 1 and possibly even to damage or destruction of the carrier substrate 1. To prevent this, it is known from the prior art to apply a backside metallization 25 which counteracts a corresponding bending. With typically used first thicknesses D1 for the component metallization 20, of, for example, a maximum of 0.8 mm, it has proven advantageous in particular to design the backside metallization 25 symmetrically to the component metallization 20, in particular with regard to its thickness. Via a cooling structure, which in turn is in particular connected to the backside metallization 25, for example by an AMB process or DCB process, the developing heat is finally conducted away from the component side BS during the production process and/or during operation of the carrier substrate 1. It is further provided that the component metallization 20, the insulation layer 10 and the cooling part metallization 30 are arranged one above the other along a stacking direction S, which is in particular perpendicular to the main extension plane HSE. However, the backside metallization 25 required for symmetry often proves to be insufficient in terms of its thermal capacity for thermal impedances due to its small thickness, particularly in overload cases in which this backside metallization 25 is intended to serve as a buffer layer.

Figure 2:
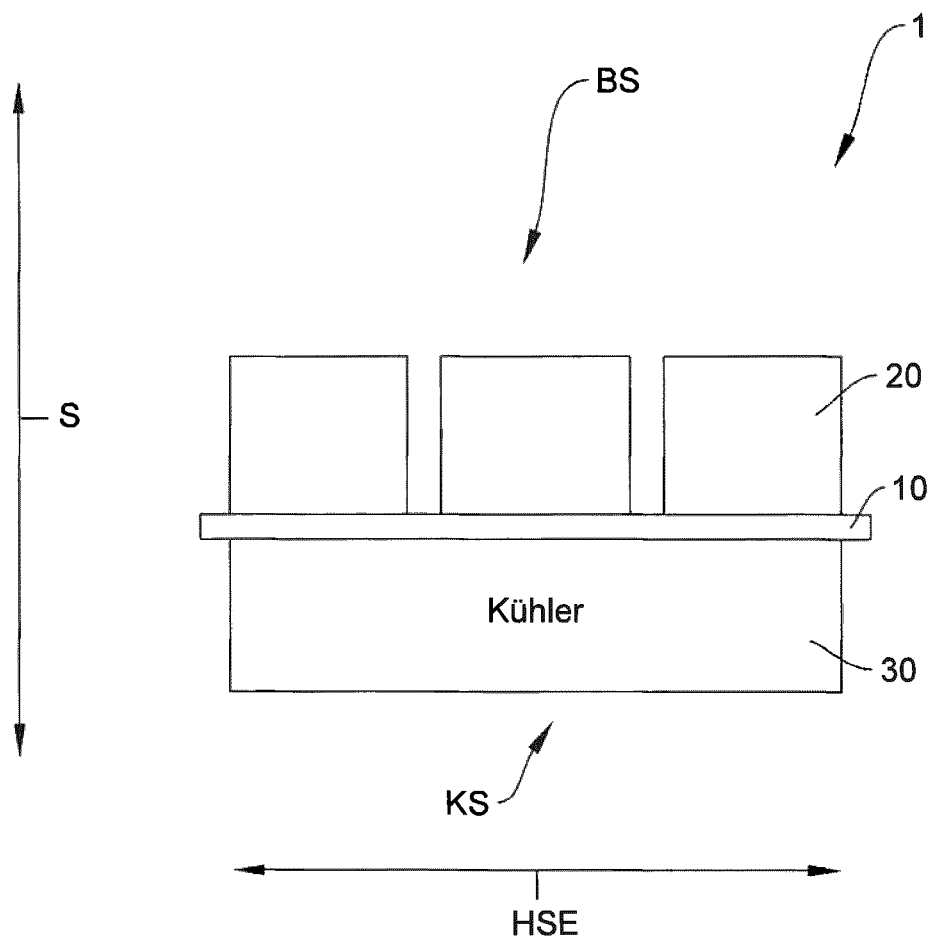
FIG. 2: a carrier substrate according to a further prior art embodiment.

FIG. 2 shows another carrier substrate 1 according to a further prior art embodiment. The exemplary embodiment shown in FIG. 2 shows a carrier substrate 1 in which the component metallizations 20 and the cooling part metallizations 30 are bonded directly or straight to the insulation layer 10 on opposite sides of the insulation layer 10. In this context, it is particularly provided that the component metallization 20 has a first thickness D1 of at least 1 mm, preferably of more than 1.3 mm and more preferably assumes a value between 1.5 and 3 mm. Furthermore, on a cooling side KS of the carrier substrate 1 opposite the component side BS, the cooling part metallization 30 has a second thickness D2 which is greater than the backside metallization 25 from the exemplary embodiment of FIG. 1 and preferably substantially corresponds to the first thickness D1. Although this comparatively large cooling side metallization 30 provides a sufficient buffer and a desired heat capacity, such an embodiment of component metallization 20 and cooling side metallization 30 increases the requirements for symmetry to avoid deflection of the entire carrier substrate 1.

Figure 3:
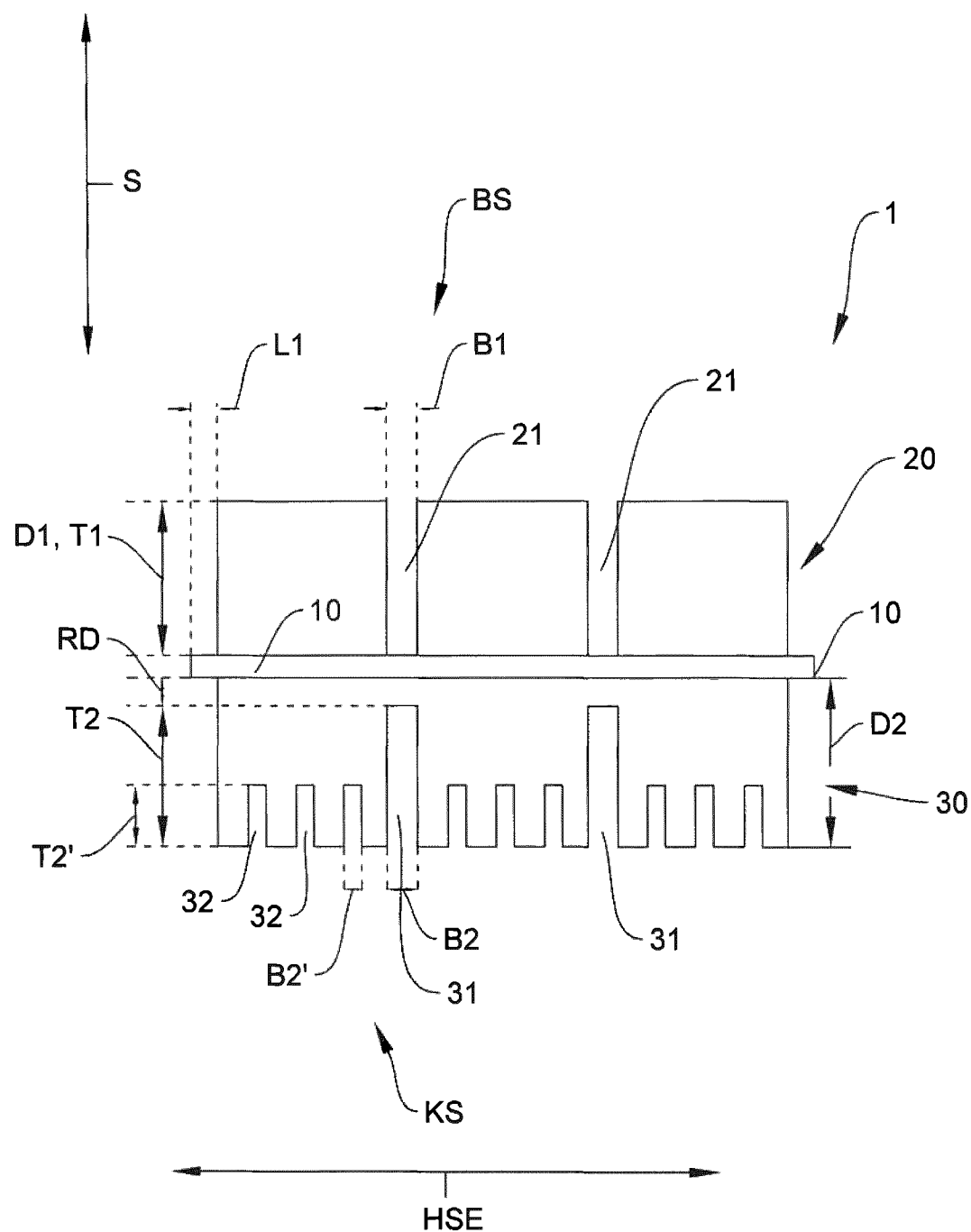
FIG. 3: a carrier substrate according to a first embodiment of the present invention.

FIG. 3 shows a carrier substrate 1 according to a first exemplary embodiment of the present invention. In the embodiment shown, the carrier substrate 1 has, in addition to a first primary structuring 21 on the component side BS, a second primary structuring 31 on the cooling side KS of the carrier substrate 1. In particular, it is provided that the first primary structuring 21 and the second primary structuring 31, as viewed in stacking direction S, are arranged congruently with one another at least in portions, for example along a direction extending perpendicular to the stacking direction S. In the embodiment shown in FIG. 3, it is further provided that the cooling part metallization 30 has a second secondary structuring 32 in addition to a second primary structuring 31. In particular, the second secondary structuring 32 forms a fin structure below a metal portion which is defined by the first primary structuring 21 and/or is bounded at least in portions. In this context, it is particularly provided that the second secondary structuring 32 has a further second depth T2' and the second primary structuring 31 has a second depth T2, the second depth T2 being greater than the further second depth T2'. In other words, the second primary structuring 31 extends deeper into the cooling part metallization 30 than the second secondary structuring 32.

It is further provided that the second primary structuring 31 has a second width B2 and the second secondary structuring 32 has a further second width B2', the second width B2 in particular being greater than the further second width B2'. Furthermore, it is particularly preferably provided that—in contrast to the component metallization 20—in the cooling part metallization 30 the second primary structuring 31 does not project and/or extend as far as the insulation layer 10. In other words, in the congruent region or section of first primary structuring 21 and second primary structuring 31, a residual metallization is formed at the end of the second primary structuring 31 facing the insulating layer 10. As a result, the second depth T2 of the cooling part metallization is smaller than the second thickness D2 of the cooling part metallization 30. Preferably, the difference between the second thickness D2 and the second depth T2 corresponds to a residual metal thickness RD, wherein a ratio of the residual metal thickness RD to the second thickness D2 assumes a value between 0.01 and 0.7, preferably between 0.05 and 0.4, and more preferably between 0.1 and 0.3.

In particular, the cooling efficiency of the cooling side KS of the carrier substrate 1 can be adapted to the planned requirements of the carrier substrate 1 by selectively adjusting the residual metal thickness RD. By the congruent arrangement of the first primary structuring 21 and the second primary structuring 31, it is furthermore possible in an advantageous manner to improve the symmetry between the component side BS and the cooling side KS, so as to counteract a corresponding deflection, in particular in the case of such carrier substrates 1 with a comparatively large first thickness D1, i.e. a first thickness D1 greater than 1 mm, preferably greater than 1.3 mm and more preferably between 1.5 and 3 mm.

In particular, it is provided that in the component metallization 20 the first thickness D1 corresponds to the first depth T1 of the first primary structuring 21. Furthermore, it is conceivable that the component metallization 20 also has a first secondary structuring (not shown) in addition to a first primary structuring 21. In this case, in particular the ratios between width and depth as described for the second primary structuring 31 and the second secondary structuring 32 apply analogously to the first primary structuring 21 and the first secondary structuring.

In particular, it is provided that the second primary structuring 31 is part of the cooling structure used for cooling the carrier substrate 1. Therein, in particular, the second primary structuring 31 forms a common cooling structure together with the second secondary structuring 32. Therein, in operation, the cooling structure, i.e., in particular the second primary structuring 31, is used to guide a cooling fluid to provide for appropriate heat dissipation. By introducing the second primary structuring 31 into the cooling part metallization 30, in particular with a second depth T2 which is greater than the further second depth T2', it is possible in an advantageous manner both to realize the necessary symmetry, which counteracts deflection of the carrier substrate 1, and at the same time to ensure that the contact area between the heat-dissipating fluid and cooling part metallization 20 is increased. This has a positive effect on the cooling efficiency of the carrier substrate 1.

Furthermore, a so-called "pullback", i.e., a projection of the insulation layer 10 relative to the outermost edge of the component metallization 20 or the cooling part metallization 30 in a direction running parallel to the main extension plane HSE, is provided. Therein, the protrusion on the component side BS may differ from that on the cooling part side KS. Preferably, the projection, in particular on the component side BS, extends over a first length L1 of more than 0.5 mm. This prevents electrical flashovers between the component side BS and the cooling part side KS.

Figure 4:
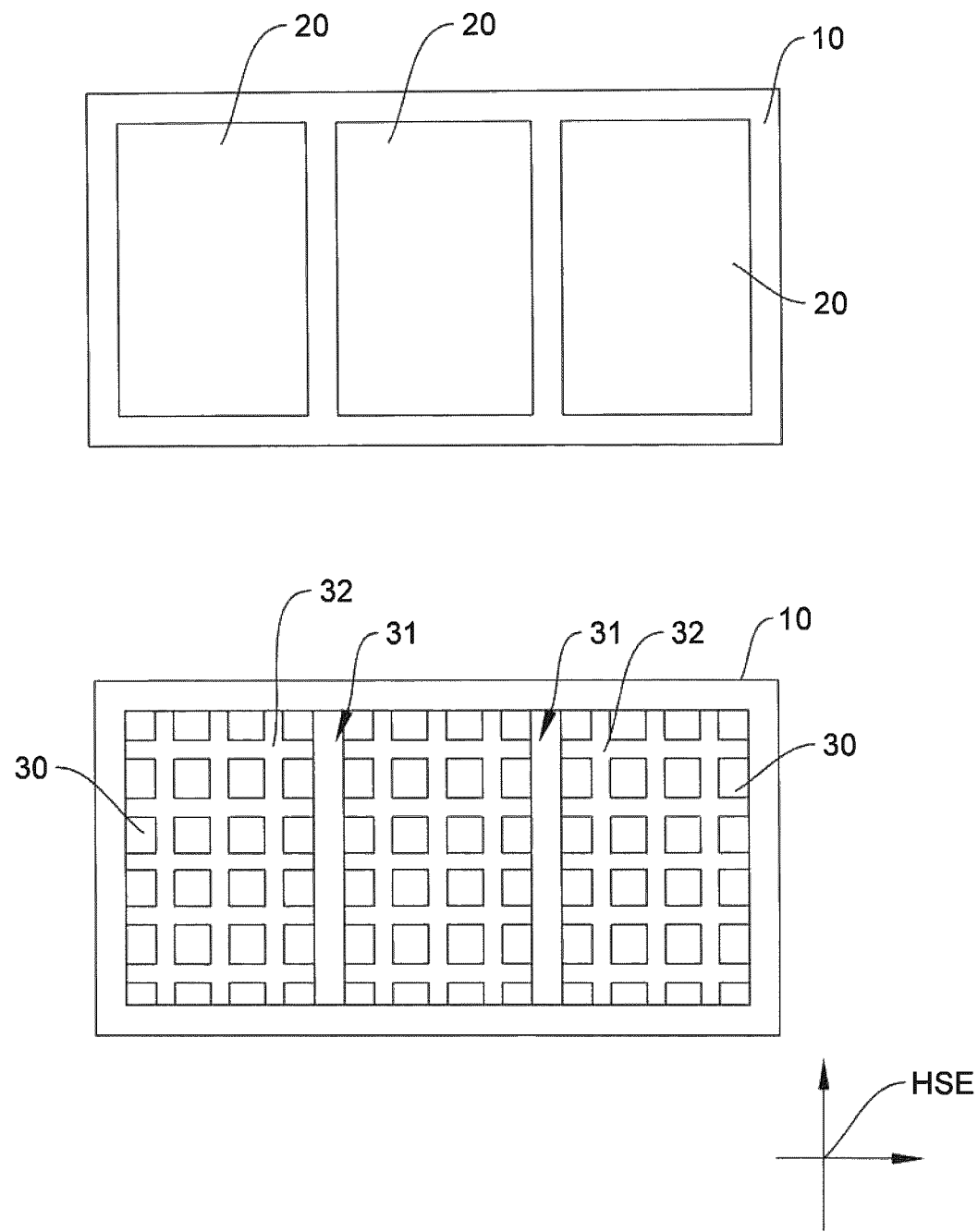
FIG. 4: carrier substrates from FIG. 3 viewed in top view on the component side and the cooling side.

In FIG. 4, the carrier substrate 1 from FIG. 3 is shown in a top view of the component side BS (top) and the cooling side KS (bottom). As can be seen, the component metallization 20 is divided into rectangular metal portions by means of the first primary structuring 21. Therein, the metal sections of the component metallization 20 have a large surface area and do not have a first secondary structuring. Furthermore, it is provided that, viewed in stacking direction S, the partial portions with the second secondary structuring 32 are arranged below the metal sections which are separated from each other by the first primary structuring 21. Furthermore, it can be seen that the second primary structuring 31 extends in a transverse direction perpendicular to the stacking direction S over an entire width of the cooling part metallization 30.

Figure 5A:
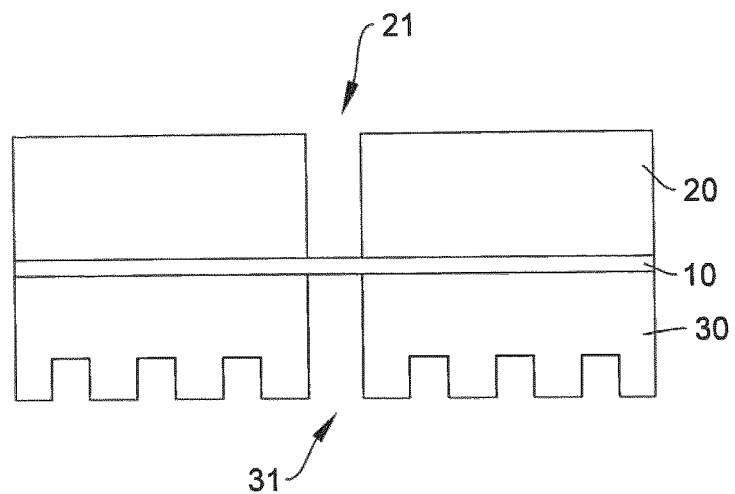
FIGS. 5a to 5h: further carrier substrates according to further exemplary embodiments of the present invention.

FIGS. 5A to 5H show further carrier substrates 1 according to further exemplary embodiments of the present invention. For example, FIG. 5A shows a carrier substrate 1 in which both the first primary structuring 21 and the second primary structuring 31 each extend and/or reach to the insulation layer 10. That is, in this exemplary embodiment, the second depth T2 (of the second primary structuring 31) also corresponds to the second thickness D2 of the cooling part metallization 30.

Figure 5B:
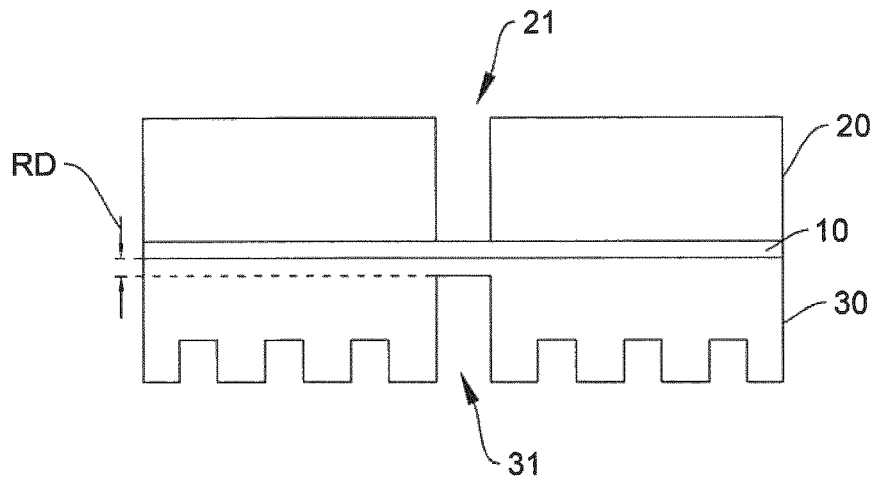

In contrast, in FIG. 5B, a residual metal thickness RD is provided at the second primary structuring 31 in the illustrated embodiments. With a complete removal of the residual metal thickness RD, as shown for example in FIG. 5A, the degree of symmetry in particular becomes relatively large. With a residual metal thickness RD for the second primary structuring 31, the corresponding residual metal thickness RD can also contribute to the cooling efficiency of the carrier substrate 1.

Figure 5C:
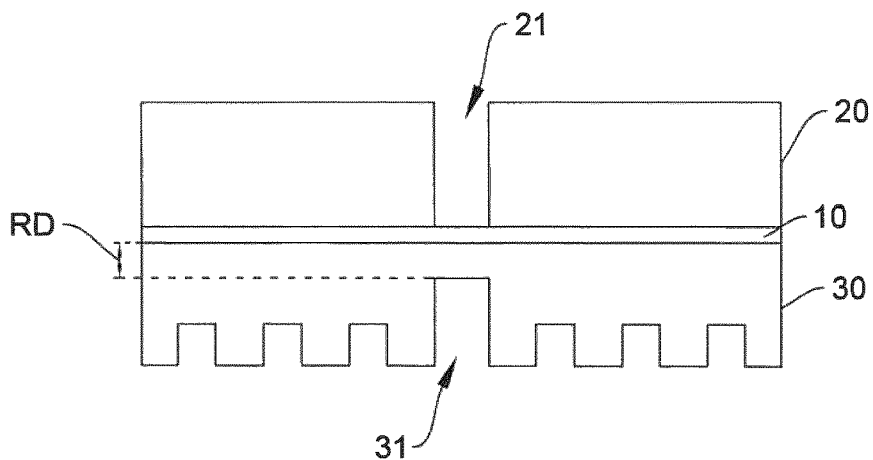

In FIG. 5C, the residual metal thickness RD is greater than in FIG. 5A. This increases the cooling efficiency and/or heat capacity characteristics for the cooling part metallization 30. It is particularly preferred that in such an example, the second thickness D2 is reduced and/or the second further depth T2' is reduced to provide for appropriate compensation with respect to loss of symmetry.

Figure 5D:
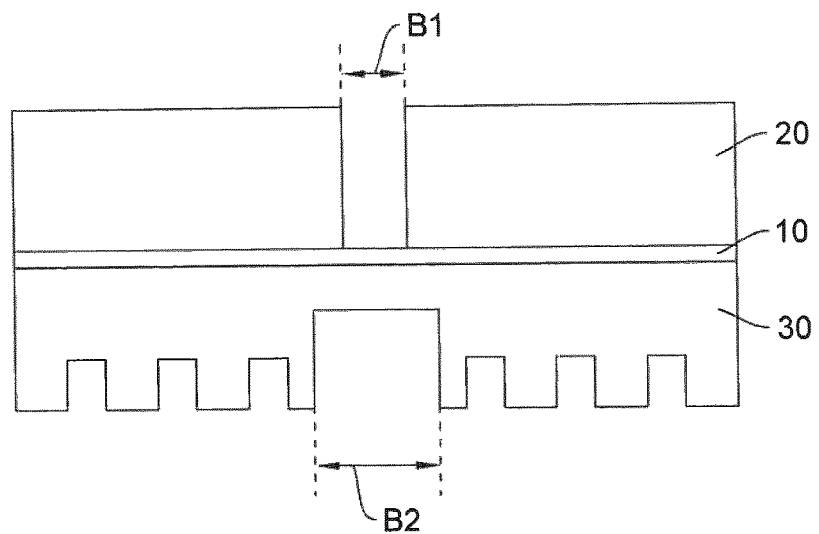
Figure 5E:
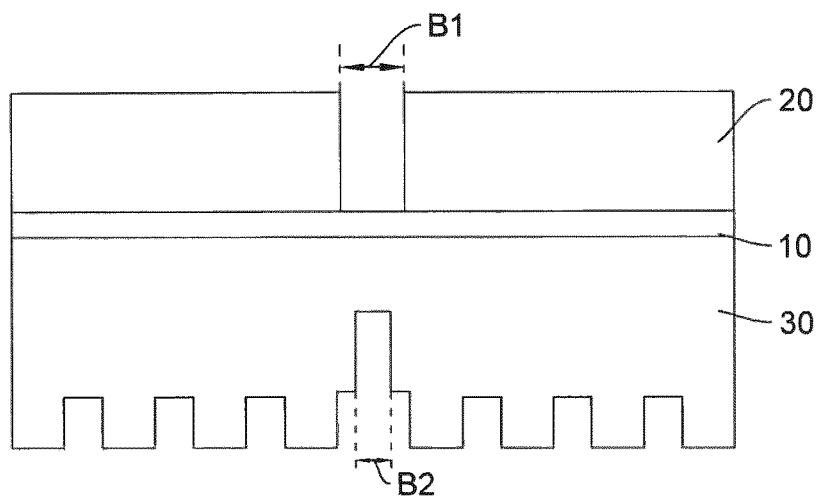

In the exemplary embodiment of FIG. 5D, a second width B2 of the second primary structuring 31 is larger than a first width B1 of the first primary structuring 21, while in the exemplary embodiment of FIG. 5E, the second width B2 is smaller than the first width B1.

Figure 5F:
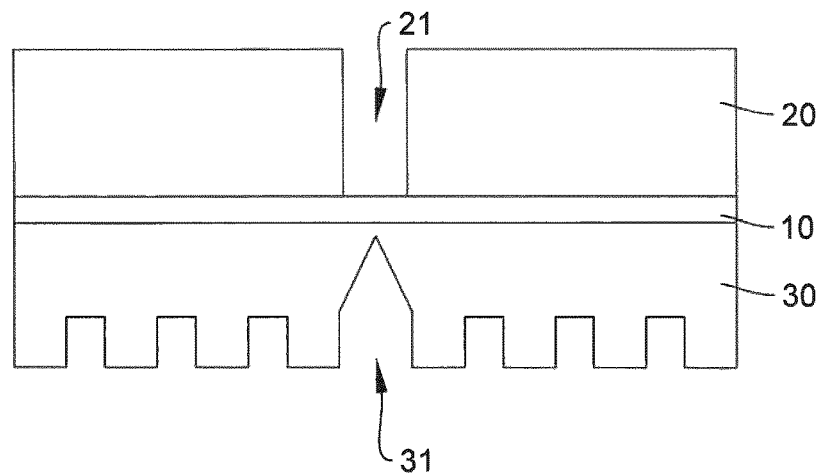

FIG. 5F shows a second primary structuring 31, which tapers in particular as seen in the direction of the insulation layer 10. For example, the end facing the insulation layer 10 forms a triangular and/or tapered end. In particular, it is provided in this case that a tapering begins after or with the further second depth T2', i.e., behind the fin structure, as viewed in stacking direction S. Furthermore, it is conceivable that the termination has straight and/or curved sections.

Figure 5G:
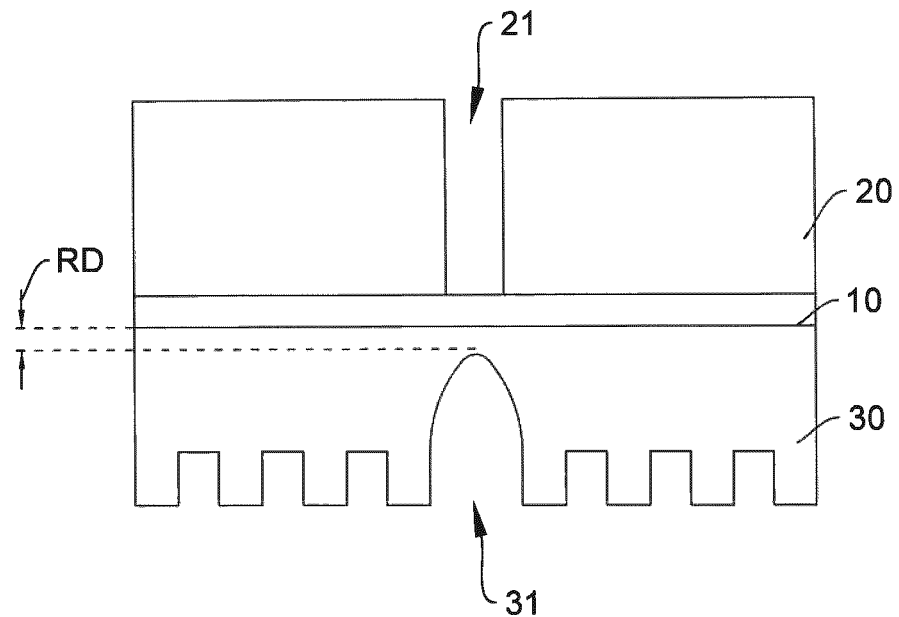

In FIG. 5G, the second primary structuring 31 is parabolic and/or round at its end facing the insulation layer 10.

Figure 5H:
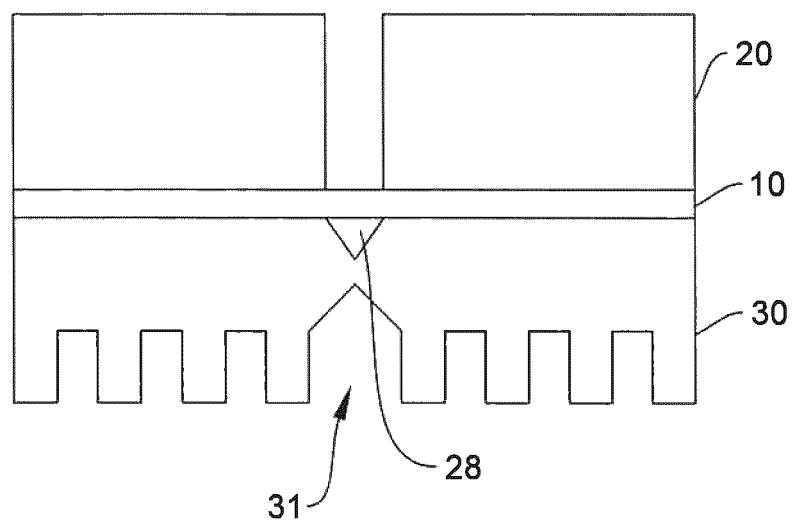

In FIG. 5H, in addition to the second primary structuring 31 facing the cooling side KS, a free space or free area 28 is provided between the cooling part metallization 30 and the insulation layer 10. In particular, in the embodiment shown, the free area 28 has a triangular cross-section in a cross-section parallel to the stacking direction S and, in particular, perpendicular to an extension direction of the second primary structuring 31. Such a free area 28 can be let into the cooling metallization 30 in particular before the bonding of the cooling part metallization 30, so that after the bonding process of the cooling part metallization 30 to the insulation layer 10 a corresponding free area 28 is formed between the cooling part metallization 30 and the insulation layer 10. It is provided that a cross-section associated with the free area 28 is smaller or larger than a cross-section associated with the second primary structuring 31.

Figure 6A:
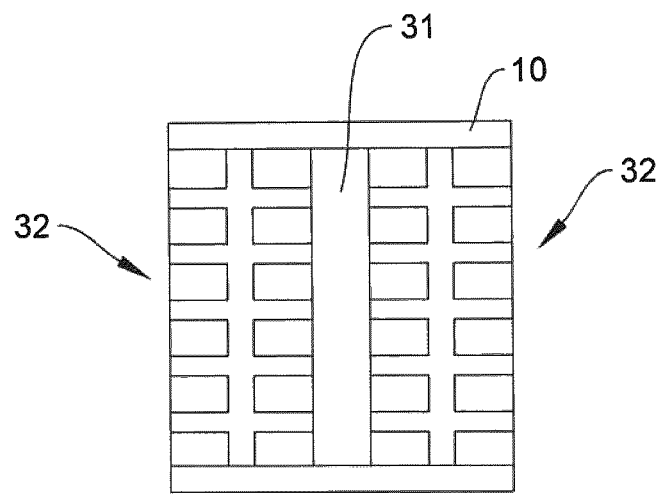
FIGS. 6a to 6d: further carrier substrates according to further exemplary embodiments of the present invention.

FIGS. 6A to 6D show further carrier substrates 1 according to further exemplary embodiments of the present invention. In particular, the different embodiments are characterized by different configurations of the second primary structuring 31 along its direction of extension perpendicular to the stacking direction S. For example, the component side BS and/or the top view of the component side BS in FIG. 6A shows that the second primary structuring 31 extends along its extension length and/or direction without interruptions and, in particular, without modification of its second width B2 (measured perpendicular to the general extension direction) over the entire width (measured here along the extension length of the first primary structuring 21) of the cooling part metallization 30 and/or extends over the entire length of the cooling part metallization 30.

Figure 6B:
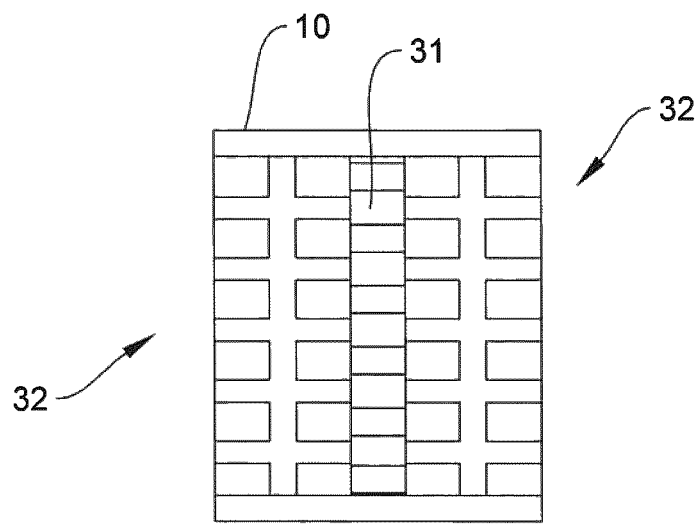

In the embodiment shown in FIG. 6B, the second primary structuring 31 is interrupted along its extension length, in particular along a direction running perpendicular to the stacking direction S. This forms comparatively short areas for the second primary structuring 31, the second width B2 of which, dimensioned perpendicularly to the extension direction, is greater than a length dimensioned parallel to the extension direction. This increases the proportion of cooling part metallizations 20, which increases the heat capacity of the cooling part metallization 20.

Figure 6C:
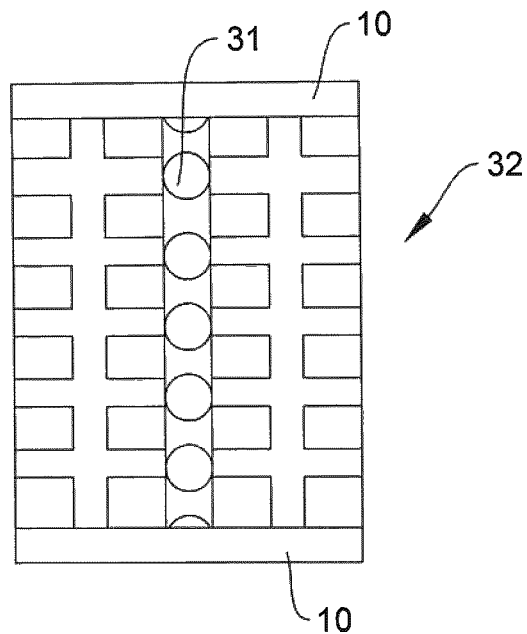
Figure 6D:
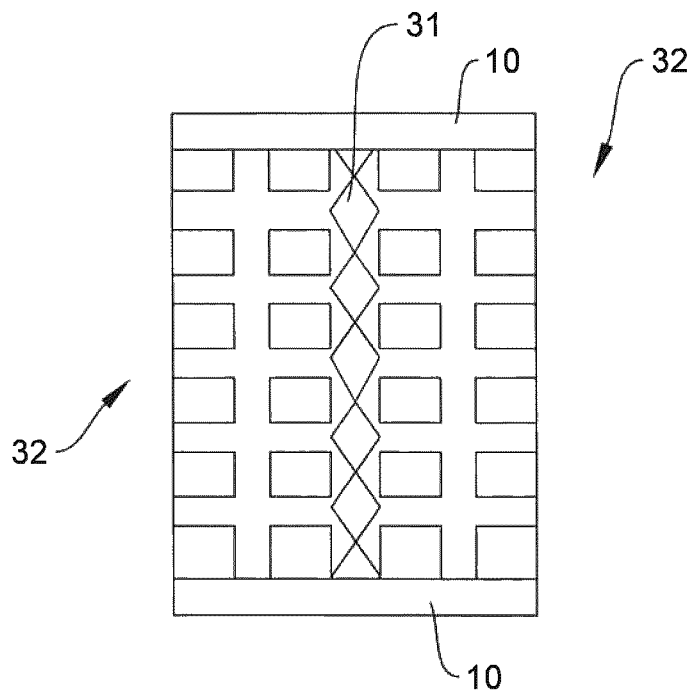

In FIGS. 6C and 6D, the second primary structurings 31 are periodically modulated and form circular or elliptical cross-sections in a plane parallel to the main extension plane HSE in FIG. 6C and/or diamond-shaped cross-sections in FIG. 6D. The different geometric shapes of the second primary structuring 31 allow, in particular, simplified adaptation to the desired requirements in terms of symmetry and heat capacity for the intended use of the carrier substrate 1.

Figure 7:
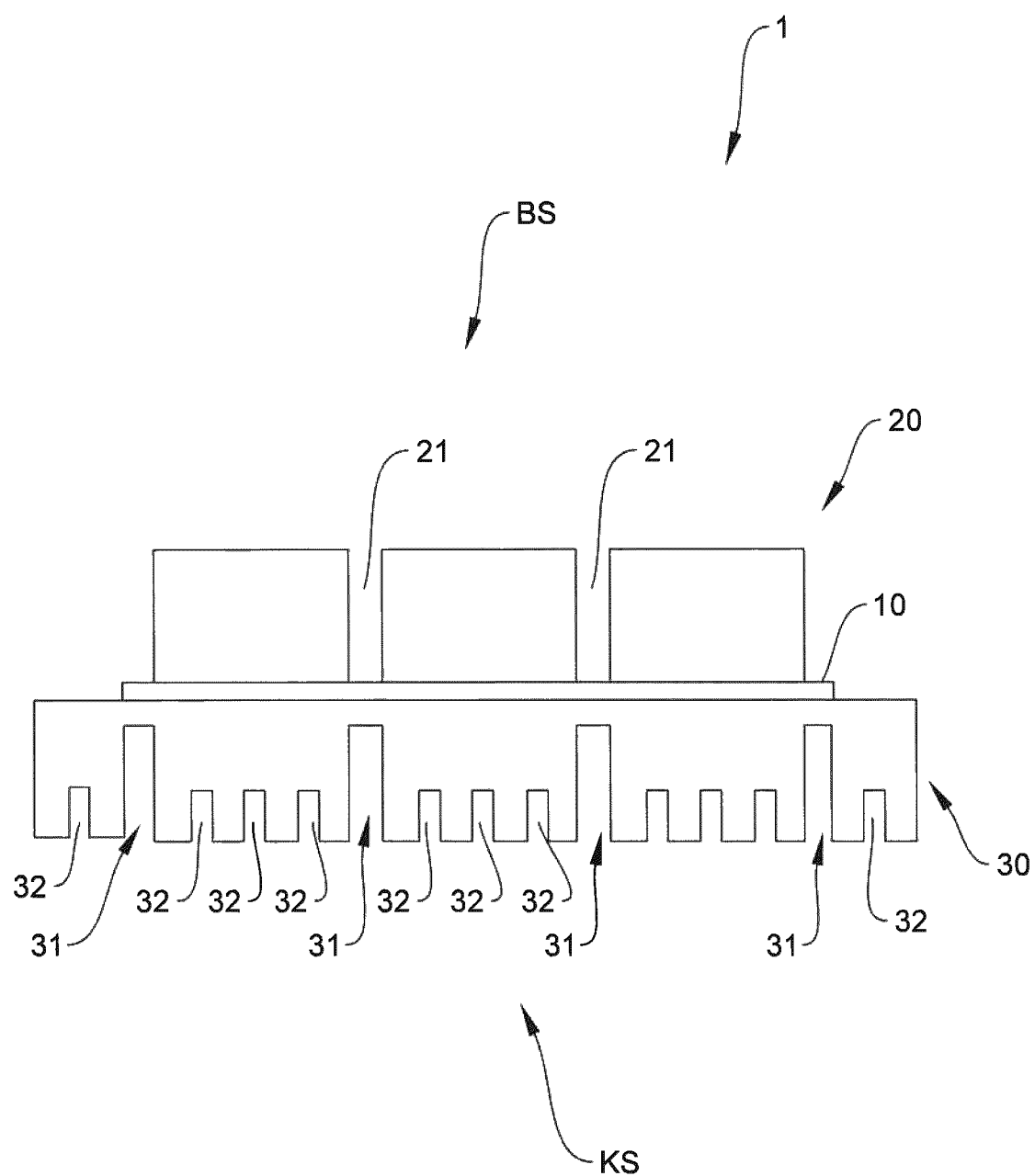
FIG. 7: a carrier substrate according to a second exemplary embodiment of the present invention.

FIG. 7 shows a carrier substrate 1 according to a second exemplary embodiment of the present invention. Here, the embodiment example shown in FIG. 7 differs in that in a direction running parallel to the main extension plane HSE, the backside metallization 25 or cooling part metallization 30 protrudes with respect to the insulation layer 10. Therein, the backside metallization 25 or the cooling part metallization 30 preferably continues the structuring, in particular the second primary structuring 31 and the second primary structuring 32, of the backside metallization 25 or the cooling part metallization 30 with the section projecting and/or overhanging relative to the insulation layer 10. Such an overhang has an advantageous effect on the heat spread, in particular in the edge region of the carrier substrate 1, and can preferably be used to seal or receive a sealing element, for example a sealing ring, with which a fluid guide can be connected to the backside metallization 25 or cooling part metallization 30. Furthermore, it is provided that in a direction parallel to the main extension plane HSE, a section with a projecting second secondary structuring 32 is shorter than a non-projecting second secondary structuring 32 between two second primary structurings 31.

Preferably, one of the second primary structures 31 is designed to be congruent and/or flush with the outermost edge of the component metallization 20 in a direction perpendicular to the main extension plane HSE. This makes it possible, for example, to decouple or weaken induced stresses in the outermost edge region of the component metallization 20 from the backside metallization 25 or the cooling part metallization 30 and/or the carrier substrate 1.

Figure 8:
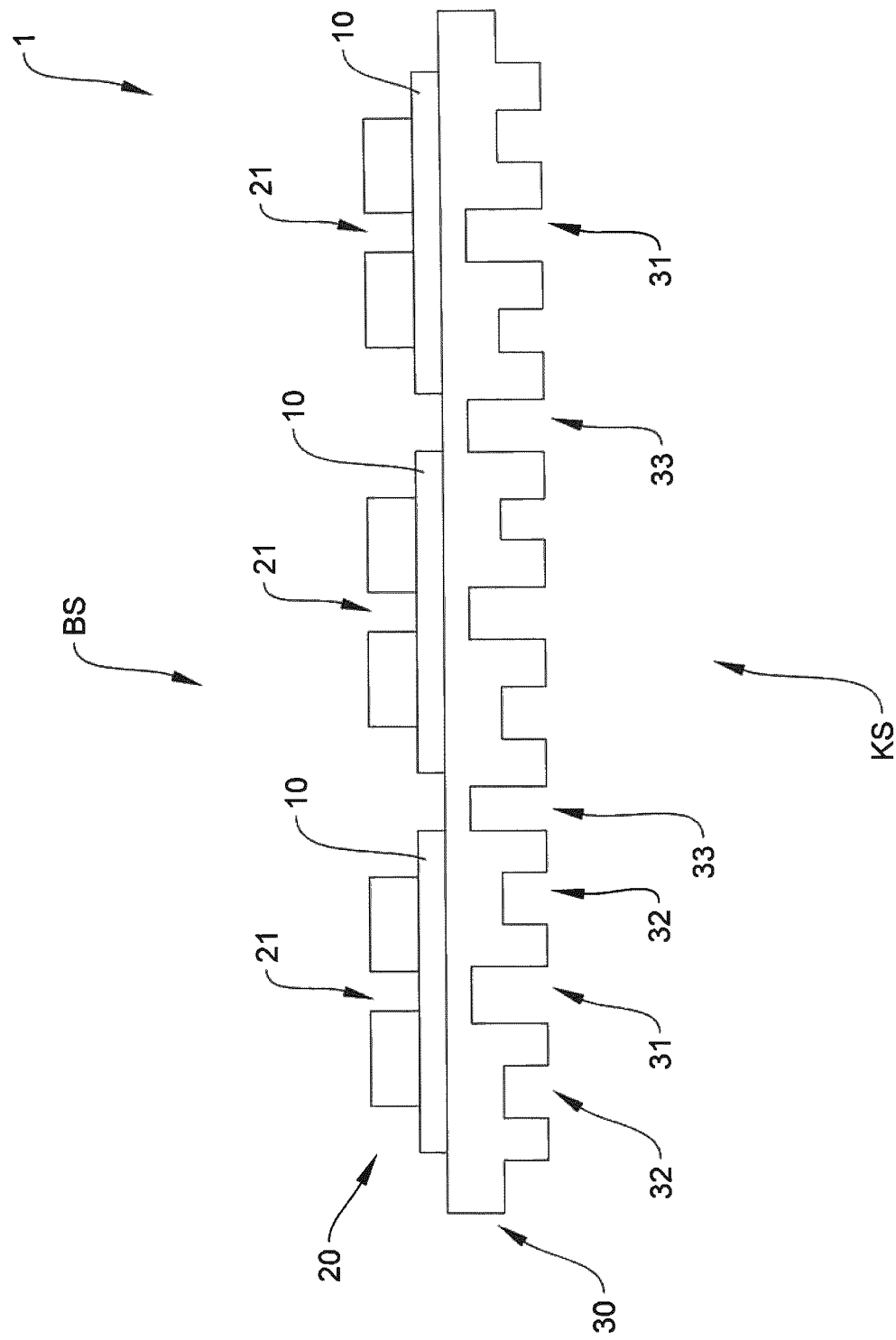
FIG. 8: a carrier substrate according to a third exemplary embodiment of the present invention.

FIG. 8 shows a carrier substrate 1 according to a third exemplary embodiment of the present invention. Therein, the embodiment of FIG. 8 differs in particular from those of FIG. 2 or 7 in that the insulation layer 10 is multi-part, i.e., several insulation layers 10 arranged next to one another in a plane running parallel to the main extension plane HSE are provided. For example, a continuous insulation layer 10 is divided into several separate portions for this purpose. Furthermore, it is provided that a second tertiary structuring 33 is provided congruently below the separation areas between two adjacent, in particular directly adjacent, separate insulation layers 10. Therein, the second tertiary structuring 33 has a depth corresponding to the second depth T2. It is also conceivable that the depth of the second tertiary structuring 33 is greater than or less than the second depth T2 or the further second depth T2'. The same applies analogously to the width to be assigned to the second tertiary structuring 33. Furthermore, it is provided that the width of the second tertiary structuring 33 is smaller than a distance between two adjacent insulation layers 10.

REFERENCE NUMERALS 1 carrier substrate
10 insulation layer
20 component metallization
21 first primary structuring
25 backside metallization
28 free area
30 cooling part metallization
31 second primary structuring
32 second secondary structuring
33 second tertiary structuring
KS cooling side
BS component side
D1 first thickness
D2 second thickness
RD residual metal thickness
B1 first width
B2 second width
B2' further second width
T1 first depth
T2 second depth
T2' further second depth
L1 first length
S stacking direction
HSE main extension plane

The invention claimed is:

1. A carrier substrate (1) for electrical components, comprising
an insulation layer (10),
a component metallization (20) which is formed on a component side (BS) and has a first primary structuring (21), and
a cooling part metallization (30) which is formed on a cooling side (KS) opposite the component side (BS) and has a second primary structuring (31),
wherein the insulation layer (10), the component metallization (20) and the cooling part metallization (30) are arranged one above the other along a stacking direction (S), and
wherein the first primary structuring (21) and the second primary structuring (31), as viewed in the stacking direction (S), run congruently at least in portions, and characterized in that the cooling part metallization (30) has a second secondary structuring (32),
wherein the second primary structuring (31) has a second depth (T2) and a second width (B2) and the second secondary structuring (32) has a further second depth (T2') and a further second width (B2'),
wherein the second depth (T2) is larger or smaller than the further second depth (T2') and/or the second width (B2) is larger or smaller than the further second width (B2').

2. The carrier substrate (1) according to claim 1, wherein the insulation layer (10) comprises a material comprising a ceramic or a composite comprising at least one ceramic layer.

3. The carrier substrate (1) according to claim 1, wherein the second secondary structuring (32) is part of the cooling structure.

4. The carrier substrate (1) according to claim 1, wherein the second primary structuring (31) is part of a cooling structure.

5. The carrier substrate (1) according to claim 1, wherein the component metallization (20) has a first thickness (D1)

dimensioned in the stacking direction (S), wherein the first thickness (D1) is at least 1 mm.

6. The carrier substrate (1) according to claim 5, wherein the component metallization (20) has a first thickness (D1) greater than 1.3 mm and more preferably between 1.5 mm and 3 mm.

7. The carrier substrate (1) according to claim 5, wherein the component metallization (20) has a first thickness (D1) between 1.5 mm and 3 mm.

8. The carrier substrate (1) according to claim 1, wherein the cooling part metallization (20) has a second thickness (D2), wherein a ratio between the first thickness (D1) to the second thickness (D2) has a value between 0.2 and 0.9.

9. The carrier substrate (1) according to claim 8, wherein a ratio between the first thickness (D1) to the second thickness (D2) has a value between 0.5 and 0.8.

10. The carrier substrate (1) according to claim 8, wherein a ratio between the first thickness (D1) to the second thickness (D2) has a value between 0.6 and 0.75.

11. The carrier substrate (1) according to claim 1, wherein the second primary structuring (31) has a residual metal thickness (RD), wherein a ratio of the residual metal thickness (RD) to the second thickness (D2) has a value between 0.01 and 0.7.

12. The carrier substrate (1) according to claim 11, wherein a ratio of the residual metal thickness (RD) to the second thickness (D2) has a value between 0.05 and 0.4.

13. The carrier substrate (1) according to claim 11, wherein a ratio of the residual metal thickness (RD) to the second thickness (D2) has a value between 0.1 and 0.3.

14. The carrier substrate (1) according to claim 1, wherein the difference between the second thickness (D2) and the second depth (T2) is approximately equal to the first thickness (D1).

15. The carrier substrate (1) according to claim 1, wherein the cooling part metallization (30) is directly bonded to the insulation layer (10).

16. The carrier substrate (1) according to claim 1, wherein a ratio of a first proportion of non-congruent portions dimensioned in stacking direction (S) to congruent portions dimensioned in stacking direction (S) between the first primary structuring (21) and the second primary structuring (31) is less than 0.6.

17. The carrier substrate (1) according to claim 16, wherein the ratio of a first proportion of non-congruent portions dimensioned in stacking direction (S) to congruent portions dimensioned in stacking direction (S) between the first primary structuring (21) and the second primary structuring (31) is less than 0.4.

18. The carrier substrate (1) according to claim 16, wherein the ratio of a first proportion of non-congruent portions dimensioned in stacking direction (S) to congruent portions dimensioned in stacking direction (S) between the first primary structuring (21) and the second primary structuring (31) is less than 0.2.

19. The carrier substrate (1) according to claim 1, wherein the second primary structuring (31) has an angular, a parabolic, or a round termination at its end facing the insulation layer (10).

20. The carrier substrate (1) according to claim 1, wherein the second primary structuring (31) is varied.

21. The carrier substrate (1) according to claim 20, wherein the second primary structuring (31) is periodically modulated.

22. The carrier substrate (1) according to claim 1, wherein the carrier substrate is a metal-ceramic substrate for electrical components.

23. The carrier substrate according to claim 1, wherein the component metallization (20) has, in addition to a first primary structuring (21), a first secondary structuring, for connections and/or conductor tracks on the component side.

24. A method for producing a carrier substrate (1) according to claim 1.

* * * * *